United States Patent
Wang et al.

(10) Patent No.: US 12,398,454 B2
(45) Date of Patent: Aug. 26, 2025

(54) FIXED-POSITION DEFECT DOPING METHOD FOR MICRO-NANOSTRUCTURE, AND NV CENTER SENSOR

(71) Applicant: UNIVERSITY OF SCIENCE AND TECHNOLOGY OF CHINA, Hefei (CN)

(72) Inventors: Mengqi Wang, Hefei (CN); Ya Wang, Hefei (CN); Haoyu Sun, Hefei (CN); Xiangyu Ye, Hefei (CN); Pei Yu, Hefei (CN); Hangyu Liu, Hefei (CN); Pengfei Wang, Hefei (CN); Fazhan Shi, Hefei (CN); Jiangfeng Du, Hefei (CN)

(73) Assignee: UNIVERSITY OF SCIENCE AND TECHNOLOGY OF CHINA, Hefei (CN)

( * ) Notice: Subject to any disclaimer, the term of this patent is extended or adjusted under 35 U.S.C. 154(b) by 263 days.

(21) Appl. No.: 18/250,396

(22) PCT Filed: Nov. 30, 2020

(86) PCT No.: PCT/CN2020/132797
§ 371 (c)(1),
(2) Date: Nov. 9, 2023

(87) PCT Pub. No.: WO2022/088372
PCT Pub. Date: May 5, 2022

(65) Prior Publication Data
US 2024/0093345 A1    Mar. 21, 2024

(30) Foreign Application Priority Data
Oct. 28, 2020 (CN) .......................... 202011178199.9

(51) Int. Cl.
C23C 14/04    (2006.01)
C23C 14/48    (2006.01)
G01D 5/26     (2006.01)

(52) U.S. Cl.
CPC ............ *C23C 14/042* (2013.01); *C23C 14/48* (2013.01); *G01D 5/268* (2013.01)

(58) Field of Classification Search
CPC ............................. C23C 14/042; C23C 14/48
See application file for complete search history.

(56) References Cited

U.S. PATENT DOCUMENTS

| | | |
|---|---|---|
| 7,126,139 B2 | 10/2006 | Schenkel et al. |
| 2014/0065793 A1 | 3/2014 | Kang et al. |
| 2017/0212098 A1* | 7/2017 | Stolovitzky ....... B01L 3/502761 |

FOREIGN PATENT DOCUMENTS

| | | |
|---|---|---|
| CN | 102683519 A | 9/2012 |
| CN | 103426764 A | 12/2013 |

(Continued)

OTHER PUBLICATIONS

Noel H.Wan etc. Efficient Extraction of Light from a Nitrogen-Vacancy Center in a Diamond Parabolic Reflector. Nano Letters. 18, pp. 2787-2793 hereinafter Nanoletters. (Year: 2018).*

(Continued)

*Primary Examiner* — Dah-Wei D. Yuan
*Assistant Examiner* — Kristen A Dagenais
(74) *Attorney, Agent, or Firm* — Westman, Champlin & Koehler, P.A.

(57) ABSTRACT

The present disclosure provides a fixed-position defect doping method for a micro-nanostructure based on a self-alignment process, including: S1, sequentially forming a sacrificial layer and a photoresist layer on a surface of a crystal substrate; S2, performing a lithography on the photoresist layer to form a mask hole according to a micro-nano (Continued)

pattern; S3, performing an isotropic etching on the sacrificial layer through the mask hole, and amplifying the micro-nano pattern to the sacrificial layer; S4, performing an ion implantation doping on an exposed crystal surface below the mask hole; S5, removing the photoresist layer, and depositing a mask material; S6, removing the sacrificial layer, and transferring a micro-nano amplified pattern in the sacrificial layer to a mask material pattern; and S7, etching an exposed crystal surface, and removing the mask material on the surface and forming a specific defect by annealing.

9 Claims, 2 Drawing Sheets

(56) References Cited

FOREIGN PATENT DOCUMENTS

| CN | 104064611 A | 9/2014 |
|---|---|---|
| CN | 104393037 A | 3/2015 |
| CN | 105460885 A | 4/2016 |
| CN | 106229256 A | 12/2016 |
| CN | 109904062 A | 6/2019 |
| CN | 111323617 A | 6/2020 |

OTHER PUBLICATIONS

International Search Report (including English translation) and Written Opinion for International Application No. PCT/CN2020/132797, dated Jul. 27, 2021, 11 pages.

J. P. Hadden et al., "Strongly enhanced photon collection from diamond defect centers under microfabricated integrated solid immersion lenses," Applied Physics Letters, Dec. 13, 2010, 97(24): 241901, https://doi.org/10.1063/1.3519847.

S. Ali Momenzadeh et al., "Nanoengineered Diamond Waveguide as a Robust Bright Platform for Nanomagnetometry Using Shallow Nitrogen Vacancy Centers," Nano letters, 2015, 15(1): 165-169, doi.org/10.1021/nl503326t.

Luozhou Li et al., "Efficient Photon Collection from a Nitrogen Vacancy Center in a Circular Bullseye Grating," Nano letters, 2015, 15(3): 1493-1497, DOI: 10.1021/nl503451j.

Noel H. Wan et al., "Efficient Extraction of Light from a Nitrogen-Vacancy Center in a Diamond Parabolic Reflector," Nano letters, 2018, 18(5): 2787-2793, DOI: 10.1021/acs.nanolett.7b04684.

David M. Toyli et al., "Chip-Scale Nanofabrication of Single Spins and Spin Arrays in Diamon," Nano Letters 2010, 10, 3168-3172, DOI: 10.102/nl102066q.

J. Meijer et al., "Towards the implanting of ions and positioning of nanoparticles with nm spatial resolution," Applied Physics A, 2008, 91(4): 567-571, Materials Science & Processing, DOI: 10.1007/s00339-008-4515-1.

Tim Schroder et al., "Scalable focused ion beam creation of nearly lifetime-limited single quantum emitters in diamond nanostructures," Article, Nature communications, 2017, 8(1): 1-7, DOI: 10.1038/ncomms 15376.

J. W. Pomeroy et al., "Solid immersion lenses for enhancing the optical resolution of thermal and electroluminescence mapping of GaN-on-SiC transistors," Journal of Applied Physics, Oct. 8, 2015, 118(14), https://doi.org/10.1063/1.4932029.

Margarita Lesik et al., "Maskless and targeted creation of arrays of colour centres in diamond using focused ion beam technology," physics status solidi (a), 2013, 210(10): 2055-2059, DOI 10.1002/pssa.201300102.

* cited by examiner

FIXED-POSITION DEFECT DOPING METHOD FOR MICRO-NANOSTRUCTURE, AND NV CENTER SENSOR

CROSS REFERENCE TO RELATED APPLICATION

This application is a Section 371 National Stage Application of International Application No. PCT/CN2020/132797, filed on Nov. 30, 2020, which published as WIPO Publication No. 2022/088372 A1, on May 5, 2022, not in English, which claims priority to Chinese Application No. 202011178199.9, filed on Oct. 28, 2020, entitled "FIXED-POSITION DEFECT DOPING METHOD FOR MICRO-NANOSTRUCTURE, AND NV CENTER SENSOR", the contents of which are incorporated herein by reference in their entireties.

TECHNICAL FIELD

The present disclosure relates to a field of a micro-nano processing technology and a quantum information technology, and in particular, to a fixed-position defect doping method and application for a micro-nanostructure based on a self-alignment process.

BACKGROUND

A solid-state quantum system is widely used and studied in a field of quantum information as it may be integrated and instrumented. Point defects in a solid usually have good spin properties and optical properties due to a protection by a solid material. Therefore, the point defects have become a focus of research and application in solid-state quantum computing, quantum precision measurement, etc., such as nitrogen-vacancy center (NV) in diamond, silicon-vacancy center (SiV), nickel-nitrogen center (NE8), point defect in silicon carbide, etc. The NV center in the diamond has become one of main solid-state systems studied in the field of quantum information by virtue of a superior spin coherence time at room temperature, an optical initialization reading means and a mature microwave control method. Especially in a field of microscopic magnetic measurement, the NV center, as a single-spin quantum sensor, exhibits outstanding advantages such as a nano-spatial resolution, a single-spin detection sensitivity, a loose working condition, non-destruction and no need for a magnetic shielding.

Optical defects represented by the NV center usually emit light weakly. Due to a limitation (such as the diamond (n=2.4), the silicon carbide (n=2.6), etc.) of a high refractive index of a crystal material itself, most of fluorescence emitted by the point defects has a total reflection effect at an interface. Therefore, a micro-nanostructure needs to be manufactured to improve an optical fluorescence collection efficiency. For example, micro-nano optical structures such as a solid immersion lens [Applied Physics Letters, 2010, 97(24): 241901, Journal of Applied Physics, 2015, 118(14): 144501], a nano-column waveguide [Nano letters, 2015, 15(1): 165-169], an ultra-thin diamond "bull's eye" [Nano letters, 2015, 15(3): 1493-1497] and a paraboloid [Nano letters, 2018, 18(5): 2787-2793] are manufactured.

An improvement effect of the optical fluorescence collection efficiency is closely related to a spatial position of defects in the micro-nano optical structure, and it is usually required that only when a spatial positioning accuracy of the defects in a center of the structure reaches 50 nm can the defects have a strong effect. A traditional method includes doping through a maskless ion implantation, which is difficult to control the spatial position of the defects in the structure, and usually less than 10% of optical structures may realize an expected enhancement effect.

An uncertainty of the spatial position caused by a process defect is a key to restrict an optical structure effect and a yield. In order to improve a yield of the micro-nano optical structure, it is required to align the micro-nanostructure with the defect doping to realize the fixed-position defect doping for the micro-nanostructure.

At present, the existing technical solutions mainly include:

1. An electron beam lithography overlay may realize an alignment using electron beam imaging [Nano Lett. 2010, 10, 3168-3172].
2. An AFM needle tip is manufactured to combine a pinhole mask, which may realize an alignment using AFM imaging [Applied Physics A, 2008, 91(4): 567-571, Patent: U.S. Pat. No. 7,126,139B2].
3. Focusing ion beam implantation may realize an alignment using ion beam imaging [Nature communications, 2017, 8(1): 1-7, physics status solidi (a), 2013, 210(10): 2055-2059].

The methods all include a complicated alignment process, and an alignment error may exist in the alignment process, which requires a high device process requirement and a high cost.

SUMMARY

An aspect of the present disclosure provides a fixed-position defect doping method for a micro-nanostructure based on a self-alignment process, including: S1, sequentially forming a sacrificial layer and a photoresist layer on a surface of a crystal substrate; S2, performing a lithography on the photoresist layer to form a mask hole according to a micro-nano pattern; S3, performing an isotropic etching on the sacrificial layer through the mask hole, and amplifying the micro-nano pattern to the sacrificial layer; S4, performing an ion implantation doping on an exposed crystal surface below the mask hole; S5, removing the photoresist layer, and depositing a mask material; S6, removing the sacrificial layer, and transferring a micro-nano amplified pattern in the sacrificial layer to a mask material pattern; and S7, etching an exposed crystal surface, and removing the mask material on the surface and forming a specific defect by annealing.

Further, in S1, the sacrificial layer and the photoresist layer form a double-layer thin film structure, and the forming method includes a smearing and a vapor deposition.

Further, in S1, a material of the sacrificial layer includes PMGI (polydimethyl glutamide), $SiO_2$ and SiN.

Further, in S2, the mask hole is a pattern formed by proportionally reducing the micro-nano pattern, and the mask hole is located right above a center of a lower-layer structure pattern.

Further, in S4, an ion type of an ion implantation is related to a type of a doping defect, and a penetration depth of ions may not exceed a thickness of the photoresist layer.

Further, in S5, the mask material is deposited by a coating process, and the coating process includes an evaporation coating and a sputtering coating.

Further, in S6, the sacrificial layer is removed by a dissolution and stripping method.

Furthermore, in S7, the exposed crystal surface is etched by a dry etching process, and the dry etching process includes a plasma etching, a reactive ion etching and an inductively coupled plasma etching.

Further, in S7, the mask material on the surface is removed by a dry etching process or a wet etching process.

Another aspect of the present disclosure provides an NV center sensor, and an NV center in the NV center sensor is manufactured by the method as described above.

DESCRIPTION OF SYMBOLS

1—PMMA;
2—PMGI;
3—diamond sample;
4—lattice defect;
5—metal mask;
6—NV center.

DETAILED DESCRIPTION OF EMBODIMENTS

In order to make objectives, technical solutions and advantages of the present disclosure clearer, the present disclosure will be further described in detail below with reference to specific embodiments and accompanying drawings.

The present disclosure provides a fixed-position defect doping method and application for a micro-nanostructure based on a self-alignment process, to at least partially solve technical problems such as a difficulty of a traditional maskless defect doping process in controlling a spatial position of defects in the micro-nanostructure, etc.

Figure 1:
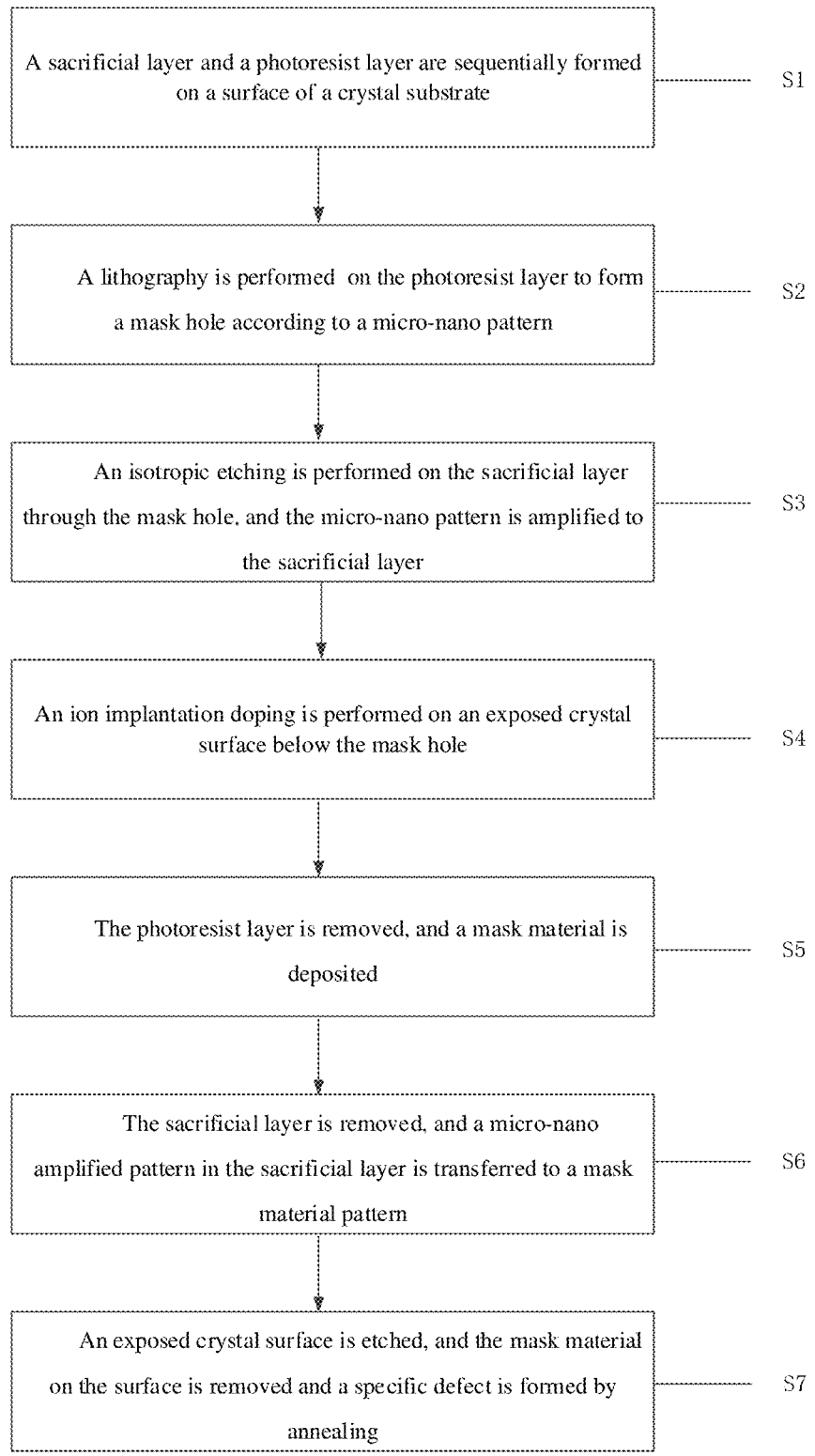
FIG. 1 schematically shows a flow chart of a fixed-position defect doping method for a micro-nanostructure based on a self-alignment process according to embodiments of the present disclosure.

A first embodiment of the present disclosure provides a fixed-position defect doping method for a micro-nanostructure based on a self-alignment process, referring to FIG. 1, including: S1, sequentially forming a sacrificial layer and a photoresist layer on a surface of a crystal substrate; S2, performing a lithography on the photoresist layer to form a mask hole according to a micro-nano pattern; S3, performing an isotropic etching on the sacrificial layer through the mask hole, and amplifying the micro-nano pattern to the sacrificial layer; S4, performing an ion implantation doping on an exposed crystal surface below the mask hole; S5, removing the photoresist layer, and depositing a mask material; S6, removing the sacrificial layer, and transferring a micro-nano amplified pattern in the sacrificial layer to a mask material pattern; and S7, etching an exposed crystal surface, and removing the mask material on the surface and forming a specific defect by annealing.

A crystal substrate is provided, and a double-layer thin film structure is formed on a surface, where a lower-layer structure is a sacrificial layer which may be isotropically etched, and a top-layer structure is a photoresist; a mask hole is manufactured on the top-layer glue structure according to a shape of a micro-nanostructure through a lithography process; an isotropic etching is performed on the lower-layer structure by using an etching solution to pass through the mask hole. A mask hole pattern is amplified to the lower-layer structure to realize a patterning of the lower-layer structure; an exposed crystal surface below the mask hole is doped through an ion implantation by using the top-layer structure as a mask; the top-layer photoresist is removed, and the mask material is deposited by using a coating process; a material of the lower-layer structure is removed by a dissolution and stripping method, so as to realize a transfer of a pattern of the lower-layer structure into a mask material pattern; an exposed crystal surface is etched by a dry etching process to form a micro-nanostructure by using the mask material pattern as an anti-etching mask. Then, a remaining mask material on the surface is removed and the specific defect is formed by annealing.

On the basis of the above-mentioned embodiments, in S1, the sacrificial layer and photoresist layer form a double-layer thin film structure, and the forming method includes a smearing and a vapor deposition.

The photoresist layer is used to manufacture the mask hole by the lithography in S2 for an ion implantation, the sacrificial layer is used to form a pattern by the isotropic etching in S3, and to form an etching mask by the coating in S5 and the removing in S6.

The smearing process is used to form a film structure by spin smearing or spraying, which is often used in materials such as a photoresist, PMGI, a spin $SiO_2$ layer, etc. The vapor deposition forms the film structure by physical vapor deposition or chemical vapor deposition, which is often used in $SiO_2$ and SiN materials. A material of the photoresist includes an ultraviolet photoresist and an electronic photoresist.

On the basis of the above-mentioned embodiments, in S1, a material of the sacrificial layer includes PMGI, $SiO_2$ and SiN.

The sacrificial layer may be PMGI, which is characterized in that in the S3 process, the isotropic etching may be performed by a tetramethylammonium hydroxide (TMAH) solution, and the process has little influence on the upper photoresist structure. When the photoresist layer is removed using acetone in the S5 process, the sacrificial layer may not dissolve in the acetone. In the S6 process, the removing is performed by using a reagent N-methylpyrrolidone (NMP) so as to obtain the mask material pattern.

The sacrificial layer may also be selected from $SiO_2$ and SiN sacrificial layers, which are characterized in that the isotropic etching may be performed by a BOE (buffered oxide etching solution) or a hydrofluoric acid solution in the S3 process, and the process has little influence on the upper photoresist structure. When the photoresist layer is removed using acetone in the S5 process, the sacrificial layer may not dissolve in the acetone. In the S6 process, the mask material pattern is obtained by using the BOE (buffered oxide etching solution) or the hydrofluoric acid solution.

On the basis of the above-mentioned embodiment, in S2, the mask hole is a pattern formed by proportionally reducing the micro-nano pattern, and the mask hole is located right above a center of a lower-layer structure pattern.

The mask hole is not only used as an isotropic etching mask of the sacrificial layer in the S3 process, but also used as a mask hole for an ion implantation in the S4 process. The mask hole is manufactured on the top-layer glue structure according to the shape of the micro-nanostructure through a lithography process, and the lithography process may include an electron beam lithography process or an ultraviolet lithography process.

On the basis of the above-mentioned embodiments, in S4, an ion type of an ion implantation is related to a type of a doping defect, and a penetration depth of ions may not exceed a thickness of the photoresist layer.

According to different types of doping defects, types of implanted ions are different. For example, doped NV centers are implanted with nitrogen-containing ions, and doped SiV centers are implanted with silicon-containing ions.

The reason why the penetration depth of the ions may not exceed the thickness of photoresist layer is that after exceeding the thickness of photoresist layer, the lithography may not stop the ions to be implanted into the crystal. Therefore, a position of the implanted ions may not be controlled.

On the basis of the above-mentioned embodiments, in S5, the mask material is deposited by a coating process, and the coating process includes an evaporation coating and a sputtering coating.

The mask material may be a metal, a metal oxide, a non-metal and a non-metal oxide. The evaporation coating process includes a thermal evaporation coating and an electron beam evaporation coating, which has advantages of a low energy and a good mask edge after peeling. The sputtering coating process has advantages of a high film density and a small particle size.

On the basis of the above-mentioned embodiments, in S6, the sacrificial layer is removed by a dissolution and stripping method.

A reagent selected in the dissolution and stripping process may be determined according to a type of a material of the lower-layer structure. For example, dissolution and stripping of the lower-layer structure PMGI may be performed by using N-methylpyrrolidone (NMP), and dissolution and stripping of the lower-layer structure $SiO_2$ and SiN may be performed by using a hydrofluoric acid-containing reagent.

On the basis of the above-mentioned embodiments, in S7, the exposed crystal surface is etched by a dry etching process, and the dry etching process includes a plasma etching, a reactive ion etching and an inductively coupled plasma etching.

The dry etching process includes an ion beam etching, a reactive plasma etching, an inductively coupled plasma etching, etc. An etching depth and an inclination angle of an etched sidewall may be realized by adjusting conditions such as an etching power, a gas ratio, an etching pressure, an etching temperature, etching time, etc., to form a specific micro-nano structure.

On the basis of the above-mentioned embodiments, in S7, the mask material on the surface is removed by a dry etching process or a wet etching process.

The mask material may be removed by either the dry etching process or the wet etching process. The dry etching process requires a plasma etching device, and has advantages of a simple operation, a stable process and a high precision. The wet etching process has an advantage of a low cost.

A second embodiment of the present disclosure provides an NV center sensor, and NV centers in the NV center sensor are manufactured by the above-mentioned method.

Figure 2:
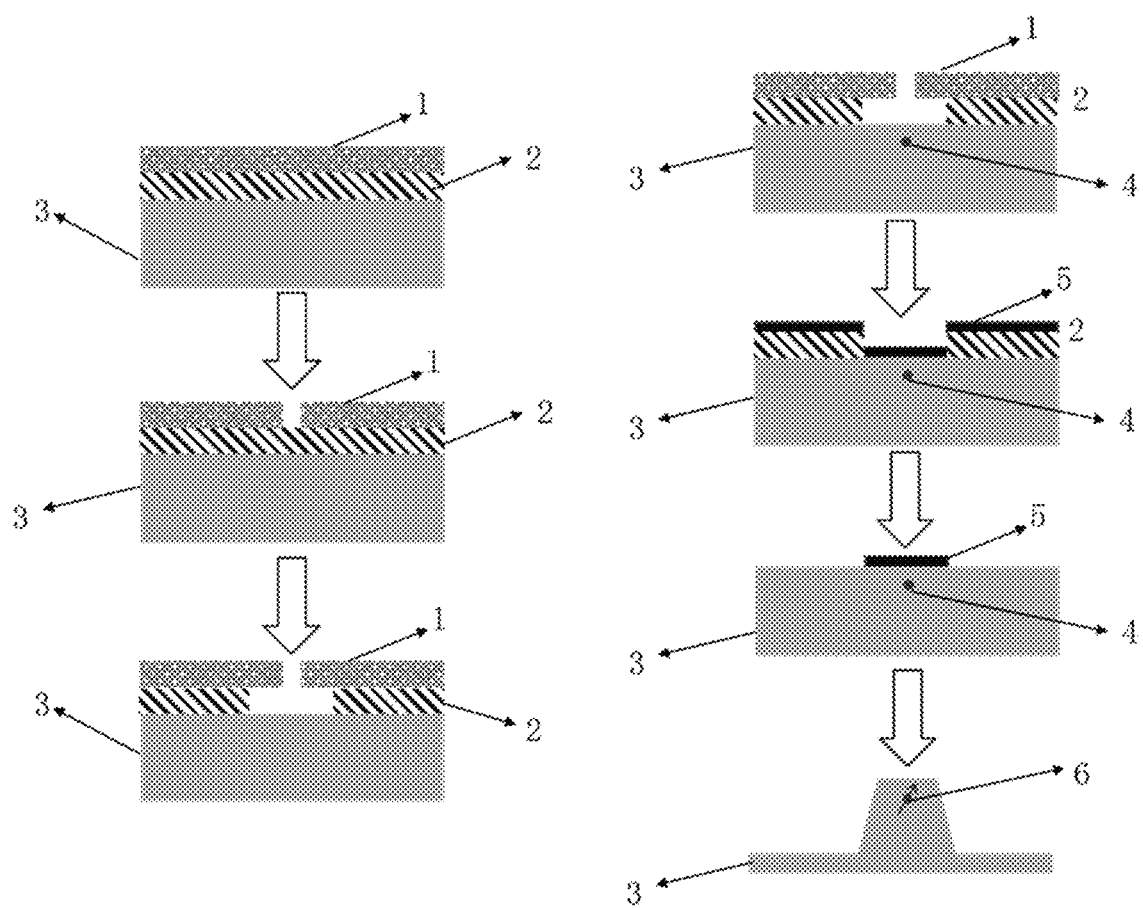
FIG. 2 schematically shows a schematic diagram of a fixed-position defect doping for a micro-nanostructure based on a self-alignment process according to embodiments of the present disclosure.

Referring to FIG. 2, the present disclosure provides a method of realizing a fixed-position doping in a micro-nanostructure. The method may be used for the fixed-position doping of point defects in diamond, silicon carbide and an h-BN micro-nanostructure. Specific implementations are provided as follows by taking a fixed-position doping of a nitrogen vacancy center in a center of an end face of a diamond nano-column waveguide as an example:

A double-layer thin film structure is formed on a surface of a diamond substrate 3, and a PMGI sacrificial layer 2 and an electron beam photoresist PMMA photoresist layer 1 are formed by using a spin smearing process, that is, S1.

An electron beam lithography is performed on the electron beam photoresist PMMA to manufacture a mask hole, the mask hole has a circular shape, and a diameter of the mask hole is smaller than a diameter of a nano-column waveguide, that is, S2.

An etching solution may not damage a top layer of the double-layer thin film structure. In this step, an isotropic etching is performed by using a tetramethylammonium hydroxide (TMAH) solution. A patterning of the lower-layer structure is realized into a shape of a final micro-nanostructure, and the mask hole is located right above a center of a lower-layer structure pattern in a substrate plane. In the embodiments, the lower-layer structure pattern is circular, and the mask hole is at the center position, that is, S3.

A position of a doped defect in the plane is controlled by an ion implantation direction. In the embodiments, the ion implantation direction is perpendicular to a surface of the substrate, and a position of a lattice defect 4 may be located in the center of the lower-layer pattern; an ion type of implanted ions is a nitrogen-containing group ion, that is, S4.

The top photoresist PMMA is dissolved using acetone without damaging the lower-layer structure PMGI sacrificial layer 2; a metal Ti is used as a mask material 5, and an evaporation coating process is preferred, that is, S5.

Dissolution and stripping of the lower-layer structure PMGI sacrificial layer 2 are performed by using a reagent N-methylpyrrolidone (NMP), that is, S6.

A diamond nano-column waveguide structure with a high fluorescence collection efficiency is formed by an inductively coupled plasma etching; the Ti metal 5 is removed by a wet etching with a BOE solution; an NV center 6 is formed by annealing in a vacuum environment of 600° C. to 1200° C., which is located at the center of the end face of the nano-column waveguide, that is, S7.

The above-mentioned embodiments complete a self-alignment fixed-position doping of the micro-nanostructure. Finally, an NV center sensor may be obtained through the embodiments, which is characterized in that the NV centers are all located at the center of the end face of the diamond nano-column waveguide structure, which may realize an expected optimal fluorescence collection efficiency and have a high yield. A working principle of the NV center sensor is to convert external information such as magnetism, electricity, temperature, etc. into an information of an NV center fluorescence intensity for reading. The NV center sensor obtained in the embodiments has a higher fluorescence signal collection efficiency, and therefore has a better detection sensitivity.

It should be noted that the sensor obtained in the patent may be combined with a scanning microscopic imaging technology to form a scanning NV center sensor. For example, instead of a method of manufacturing a nano-column waveguide structure in patent CN202010100070.X, a yield of the sensor may be improved.

The fixed-position defect doping method and application for the micro-nanostructure based on the self-alignment process provided by embodiments of the present disclosure may realize a fixed-position doping in the micro-nanostructure, and effectively improve an accuracy of a position of defect in the micro-nanostructure. An impact of a spatial position uncertainty on an optical structure effect and a yield may be removed. A high-quality NV center sensor manufactured by the method may be obtained. The method provided by the present disclosure is based on the self-alignment process, which does not require an alignment operation, has a high precision and a simple process, and has no alignment error.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A fixed-position defect doping method for a quantum computing micro-nanostructure based on a self-alignment process, comprising:
    S1, sequentially a lithography on the photoresist layer to form a mask hole according to a micro-nano pattern;
    S2, performing a lithography on the photoresist layer to form a mask hole according to a micro-nano pattern;
    S3, performing an isotropic etching on the sacrificial layer through the mask hole, and amplifying the micro-nano pattern to the sacrificial layer;
    S4, performing an ion implantation doping on an exposed crystal surface below the mask hole;
    S5, removing the photoresist layer, and depositing a mask material;
    S6, removing the sacrificial layer, and transferring a micro-nano amplified pattern in the sacrificial layer to a mask material pattern; and
    S7, etching an exposed crystal surface, and removing the mask material on the surface and forming a specific defect by annealing.

2. The fixed-position defect doping method for the micro-nanostructure based on the self-alignment process according to claim 1, wherein in S1, the sacrificial layer and the photoresist layer form a double-layer thin film structure, and the forming method comprises a smearing and a vapor deposition.

3. The fixed-position defect doping method for the micro-nanostructure based on the self-alignment process according to claim 1, wherein in S1, a material of the sacrificial layer comprises PMGI (polydimethyl glutamide), $SiO_2$ and SiN.

4. The fixed-position defect doping method for the micro-nanostructure based on the self-alignment process according to claim 1, wherein in S2, the mask hole is a pattern formed by proportionally reducing the micro-nano pattern, and the mask hole is located right above a center of a lower-layer structure pattern.

5. The fixed-position defect doping method for the micro-nanostructure based on the self-alignment process according to claim 1, wherein in S4, an ion type of an ion implantation is related to a type of a doping defect, and a penetration depth of ions does not exceed a thickness of the photoresist layer.

6. The fixed-position defect doping method for the micro-nanostructure based on the self-alignment process according to claim 1, wherein in S5, the mask material is deposited by a coating process, and the coating process comprises an evaporation coating and a sputtering coating.

7. The fixed-position defect doping method for the micro-nanostructure based on the self-alignment process according to claim 1, wherein in S6, the sacrificial layer is removed by a dissolution and stripping method.

8. The fixed-position defect doping method for the micro-nanostructure based on the self-alignment process according to claim 1, wherein in S7, the exposed crystal surface is etched by a dry etching process, and the dry etching process comprises a plasma etching, a reactive ion etching and an inductively coupled plasma etching.

9. The fixed-position defect doping method for the micro-nanostructure based on the self-alignment process according to claim 1, wherein in S7, the mask material on the surface is removed by a dry etching process or a wet etching process.

* * * * *